(12) United States Patent
Kim et al.

(10) Patent No.: US 6,214,637 B1
(45) Date of Patent: Apr. 10, 2001

(54) METHOD OF FORMING A PHOTORESIST PATTERN ON A SEMICONDUCTOR SUBSTRATE USING AN ANTI-REFLECTIVE COATING DEPOSITED USING ONLY A HYDROCARBON BASED GAS

(75) Inventors: Yong-beom Kim, Sungnam; Chang-hwan Kim, Namcheju-gun, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/559,268

(22) Filed: Apr. 27, 2000

(30) Foreign Application Priority Data

Apr. 30, 1999 (KR) .................................................. 99-15637

(51) Int. Cl.$^7$ .......................... H01L 21/00; H01L 21/1763
(52) U.S. Cl. .............................. 438/72; 438/636; 438/152
(58) Field of Search .............................. 438/636, 72, 952, 438/694, 689, 717, 236, 758, 761, 783, 79

(56) References Cited

U.S. PATENT DOCUMENTS

| 4,663,183 | * | 5/1987 | Ovshinsky et al. | .................... 427/39 |
|---|---|---|---|---|
| 5,569,501 | | 10/1996 | Bailey et al. . | |
| 5,986,318 | * | 11/1999 | Kim et al. | ............................. 257/437 |
| 6,007,732 | * | 12/1999 | Hashimoto et al. | ................... 216/47 |
| 6,054,254 | * | 4/2000 | Sato et al. | ............................ 430/322 |

FOREIGN PATENT DOCUMENTS 97-42925   7/1997   (JP) .

* cited by examiner

*Primary Examiner*—Vu A. Le
*Assistant Examiner*—Adom Pyonin
(74) *Attorney, Agent, or Firm*—Jones Volentine, LLC

(57) ABSTRACT

A method of forming a photoresist pattern having a uniformly fine line width, and a method of manufacturing a semiconductor device using such a photoresist pattern as a mask, include the step of forming an anti-reflective coating (ARC) using only a hydrocarbon based gas. A highly reflective layer is formed on a semiconductor substrate on which an underlayer is disposed. Using only a hydrocarbon based gas, the ARC is formed on the highly reflective layer. A photoresist layer is formed on the ARC, and is exposed and developed to form a photoresist pattern on the ARC. The ARC and the highly reflective layer under the photoresist pattern are etched using the photoresist pattern as a mask. Thereafter, the photoresist pattern and the ARC are simultaneously removed. The ARC is of an amorphous silicon film having high etching selectivity and being easily removed along with the photoresist pattern.

30 Claims, 10 Drawing Sheets

METHOD OF FORMING A PHOTORESIST PATTERN ON A SEMICONDUCTOR SUBSTRATE USING AN ANTI-REFLECTIVE COATING DEPOSITED USING ONLY A HYDROCARBON BASED GAS

BACKGROUND OF THE INVENTION

1. Field of the Invention

The present invention relates to a method of manufacturing a semiconductor device. More particularly, the present invention relates to a method of forming, on a semiconductor substrate, a photoresist pattern used for etching a highly reflective layer.

2. Description of the Related Art

As the integration and performance of semiconductor devices continues to increase, a higher level of technology is required to form the fine patterns necessary to produce such highly integrated and high performance semiconductor devices. The fine patterns of semiconductor devices are generally formed through a photolithography process. However, during photolithography, light reflected to a photoresist layer from a layer disposed beneath the photoresist layer causes the following problems.

First, it is difficult to produce a fine line width because a ripple is generated in the profile of the photoresist pattern due to a standing wave generated by the interference of light waves propagating in the photoresist layer. Although the ripple is removed during post-exposure baking, the photoresist pattern is undercut or is deformed so as to have the shape of a tail.

Second, although constant exposure energy is used, a swing effect occurs in which the amount of light absorbed by the photoresist layer varies according to the thickness of the photoresist layer. The swing effect also occurs due to the interference of light waves in the photoresist layer. The swing effect makes it difficult to produce a fine line width within a required range.

Third, notching or bridging is produced in the photoresist pattern by light reflecting from the region of a step in an underlayer, i.e., a layer produced beneath the photoresist pattern during the manufacture of the semiconductor device.

FIGS. 1 and 2 illustrate a conventional manufacturing process in which these problems are likely to arise.

Referring first to FIG. 1, an underlayer 52 having a step difference is formed on a semiconductor substrate 50. A highly reflective layer 54 having a high refractive index, such as a transparent insulating film, is formed on the underlayer 52. A photoresist layer 56 is coated on the highly reflective layer 54. Light 62 produced by exposure equipment (not shown) is passed through a mask 60, having a light blocking layer 58, in order to irradiate selected portions of the photoresist layer 56.

Referring now to FIG. 2, after the photoresist layer 56 is exposed through the process shown in FIG. 1, the photoresist layer 56 is developed to form photoresist patterns 64 and 66. The photoresist pattern 64 formed over a region of the underlayer 52 in which there is no step difference has a fine line width that is relatively uniform. However, the photoresist pattern 66 formed from that part of the photoresist layer 56 overlying the step difference in the underlayer 52 has a deformed line width pattern. This deformation is produced due to the interference of light waves 62 irradiating the highly reflective layer 54. When the deformation becomes severe, a notching or bridging defect, which is a critical defect in the fine line width pattern, is produced.

A conventional process has employed an anti-reflective coating (ARC) to combat these problems. FIG. 3 illustrates a conventional method of manufacturing a semiconductor device using such an anti-reflective coating (ARC).

In FIG. 3, reference numeral 68 denotes an ARC formed between the photoresist layer 56 and the highly reflective layer 54. In this case, the light reflected from the underlayer 54 and the ARC 68 to the photoresist layer 56 consists of the light ê1, reflected from the interface between the ARC 68 and the photoresist layer 56, and the light ê2, reflected from the interface between the highly reflective layer 54 and the ARC 68. The ARC can reduce the amount of reflected light ê1+ê2 reaching the photoresist layer 56 by ensuring that the phase difference between ê1 and ê2 is 180° so as to give rise to destructive interference, or by absorbing almost all of the reflected light ê1 or ê2. In the former case the ARC is referred to as an interference type of ARC and in the latter case as an absorption type of ARC. A hybrid type of ARC having some of the characteristics of an interference type of ARC and an absorption type of ARC has also been developed.

The forming of such ARCs by plasma enhanced chemical vapor deposition (PECVD) using a gas mixture of hydrocarbon and helium has been disclosed in U.S. Pat. No. 5,569,501 issuing on Oct. 29, 1996 and entitled "Diamond-like Carbon Films Form Hydrocarbon Helium Plasma". In the PECVD method, an amorphous carbon layer is formed by controlling the temperature only under the substrate in a plasma chamber. However, this process is problematic in that the helium used as a carrier gas damages the anti-reflective coating during the generation of plasma or otherwise acts to limit the quality of the anti-reflective coating which can be produced.

SUMMARY OF THE INVENTION

It is an object of the present invention to provide a method of forming a photoresist pattern, having a fine uniform line width that is free of bridging or notching, on a semiconductor substrate on which a stepped highly reflective layer has been formed.

To achieve this object, the method includes a step of forming an antireflective coating (ARC) using only a hydrocarbon based gas on the highly reflective layer. The hydrocarbon based gas is preferably methane, ethane, propane, butane, acetylene, propene, or n-butane gas. The photoresist pattern is then formed on the ARC.

Another object of the present invention is to provide such a method of forming a photoresist pattern, in which the anti-reflective coating (ARC) has excellent etching selectivity, is economical to produce, and can be easily removed once the photoresist pattern has been formed.

To achieve this object, the ARC is formed by plasma enhanced chemical vapor deposition (PECVD), during which the temperature on and under the substrate is controlled. In this case, an amorphous carbon ARC layer is produced from the hydrocarbon based gas. The amorphous carbon film preferably has a refractive index of 1.2 to 2.5, and an extinction coefficient of 0.2 to 0.8.

The semiconductor substrate is preferably a single crystal silicon substrate, an SOI substrate, an SOS substrate, or a gallium arsenide substrate. The highly reflective layer is typically formed of W, $WSi_x$, $TiSi_x$, Al, or an Al alloy.

To assist the ARC in preventing excessive light from reflecting to the photoresist from the highly reflective layer, an insulating film can be interposed between the highly reflective layer and the photoresist. The insulating film may be formed between the highly reflective layer and the ARC or between the photoresist and the ARC. The insulating film is preferably formed of polysilicon oxide, thermally grown silicon oxide, or SiON.

The method of the present invention may also include a step of adding at least one additive selected from the group consisting of oxygen, tin, lead, silicon, fluorine, and chlorine to the amorphous carbon film. The density of the ARC is preferably increased by subjecting the ARC to an annealing process, or a plasma process, an E-beam process, and a curing process.

According to the present invention, once the photoresist pattern is formed, the ARC and the highly reflective layer can be etched using the photoresist pattern as a mask. The photoresist pattern and the ARC can be simultaneously removed from the resultant because the ARC is of an organic material.

The ARC is preferably formed to a thickness of 150 to 10,000 Å. A mixture of oxygen and argon gases is preferably used for etching the ARC. The highly reflective layer may be sequentially or simultaneously removed with the ARC.

According to the present invention, using only a hydrocarbon based gas in forming the ARC keeps the manufacturing costs low compared to when using several thin film forming gases in forming the ARC. Secondly, because the ARC and the photoresist pattern can be removed simultaneously, it is not necessary to perform an additional dry etching step to remove the ARC, and the production process is simplified. Third, the present invention makes it relatively easy to form the ARC and, through the use of only a single gas to form the ARC, minimizes the number of process variations which could unduly influence the formation of the ARC.

BRIEF DESCRIPTION OF THE DRAWINGS

The above and other objects, features and advantages of the present invention will become more apparent from the following detailed description of preferred embodiments thereof made with reference to the attached drawings, of which.

DETAILED DESCRIPTION OF THE PREFERRED EMBODIMENTS

Figure 1:
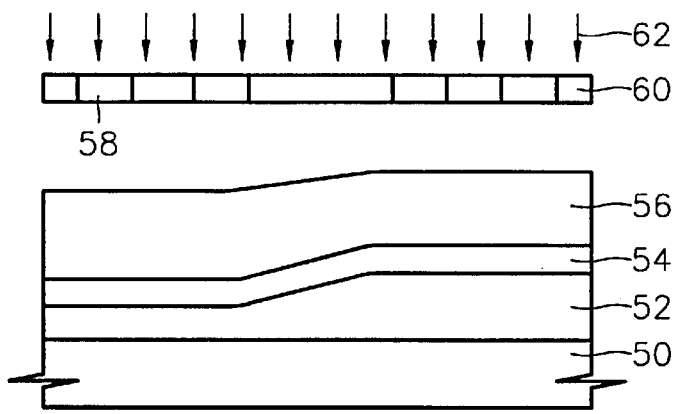
FIGS. 1 and 2 are sectional views, respectively, of a semiconductor substrate on which a highly reflective layer is formed according to the prior art, and showing the resulting deformation in the photoresist pattern.
Figure 2:
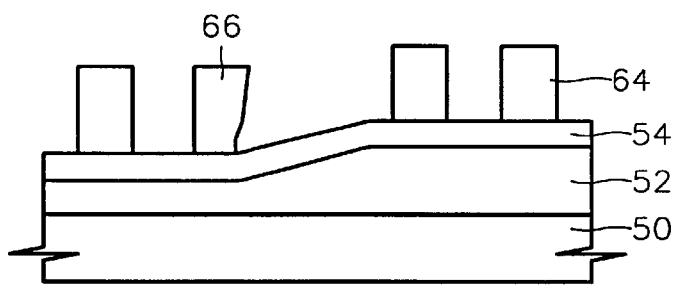
Figure 3:
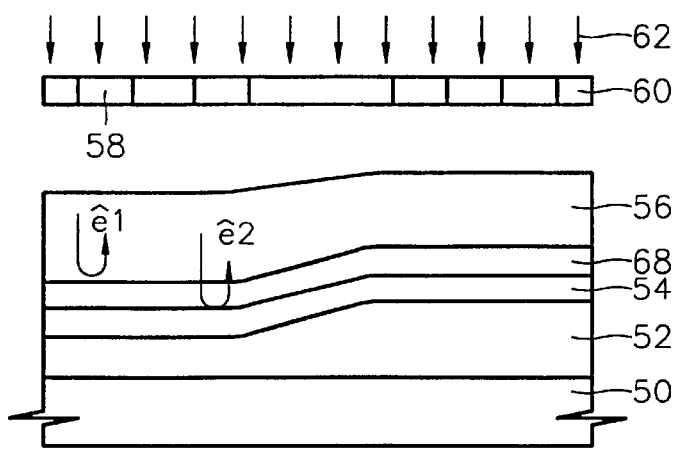
FIG. 3 is a similar sectional view but showing the use of an anti-reflective coating (ARC) according to the prior art.
Figure 4:
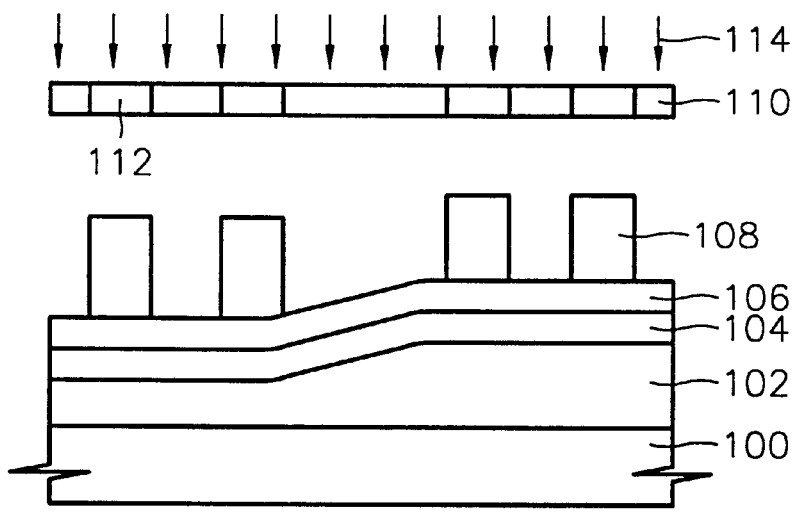
FIG. 4 is a sectional view of a semiconductor substrate, and shows a first embodiment of a method of forming a photoresist pattern using an ARC according to the present invention.

Referring to FIG. 4, an underlayer 102 such as a transistor or a bit line is formed on a semiconductor substrate 100. The underlayer 102 can be any type of layer in which a step is formed during the process of forming the lower portion of the semiconductor device. The semiconductor substrate 100 may be a single crystal silicon substrate, a silicon on insulator (SOI) substrate, a silicon on sapphire (SOS) substrate, or a gallium-arsenide substrate. A highly reflective layer 104 to be etched or implanted with ions is formed on the stepped underlayer 102. W, $WSi_x$, $TiSi_x$, Al, and Al alloy are representative examples of the materials used to form the highly reflective layer 104 and having a high refractive index sufficient to cause the photoresist to be deformed during etching.

An ARC 106 is formed by plasma enhanced CVD (PECVD). For this technique, various reaction mechanisms in the form of liquid and gas, such as methane, ethane, propane, butane, acetylene, propene, and n-butane gas, can be injected into the chamber. However, in the present invention, methane gas $CH_4$ is preferably used. Also, in the prior art, helium is used as a carrier gas for generating plasma. However, in the present invention, the ARC 106 is formed of an amorphous carbon film using only the methane gas $CH_4$. That is, no carrier gas is used.

The amorphous carbon film has an excellent etching selectivity with other layers and is easily removed since its characteristics are similar to that of the photoresist. In the prior art, the ARC is removed by dry etching. However, in the present invention, the ARC can be simply removed using only a cleaning process performed subsequent to the ashing process and the $H_2SO_4$ stripping process which are performed to remove the photoresist pattern. Forming the ARC using only the relatively inexpensive methane gas $CH_4$ also has the advantage of keeping manufacturing costs to a minimum. The ARC can be provided with the desired refractive index, composition, and chemical characteristics by using additives such as oxygen, tin, lead, silicon, fluorine, and chlorine.

When an ARC is formed by PECVD, the temperature in the chamber affects the characteristics of the layer. In the present invention, it is possible to impart desired characteristics to the ARC by controlling the temperature to between 0 and 400° C., desirably 200° C. at the upper and lower parts of the substrate. Here, the upper parts means the showerhead and the lower parts means substrate of chamber.

Specific conditions for initially forming an ARC 106 of an amorphous carbon film according to the present invention are as follows. First, 250±10 sccm of methane gas $CH_4$ is injected into the reaction chamber. The RF power is controlled to 150±10 W. Under such conditions, an amorphous carbon film having a refractive index of 1.0 and an extinction coefficient of 0.05 in the band of a deep UV (DUV; 248 nm) wavelength can be formed. An ARC is generally effective when its refractive index is between 1.2 and 2.5 and its extinction coefficient is between 0.2 and 0.8. Here, the term extinction coefficient refers to a indicator of the degree to which light can pass through a layer. The amorphous carbon film, i.e., the ARC 106 can be formed in a thickness of between 100 Å and 10,000 Å depending upon the etching selectivity characteristic of the highly reflective layer 104, i.e., the underlayer. In general, when the highly reflective layer is an insulating film, the highly reflective film is made thin. When the highly reflective film is a conductive layer, the highly reflective film is made thick.

To increase the refractive index and extinction coefficient of the ARC, the density of the ARC layer 106 is increased by performing an in-situ annealing process after initially forming the ARC 106, or by performing an additional RF plasma process, an E-beam process, and a curing process.

A photoresist layer is coated on an ARC 106 formed of the amorphous carbon film according to the present invention. A photoresist pattern 108 is formed from the photoresist layer using light 114 having a wavelength of no more than 450 nm, such as 436 nm, 365 nm, 248 nm, or 193 nm, and a mask 110 having a light shield layer 112. Because the ARC 106 will prevent the photoresist layer from experiencing the standing wave and swing effects, the resulting photoresist pattern 108 has an excellent shape. In this case, a positive photoresist, a negative photoresist, or i-line and deep UV (DUV) photoresists can be used.

Figure 5:
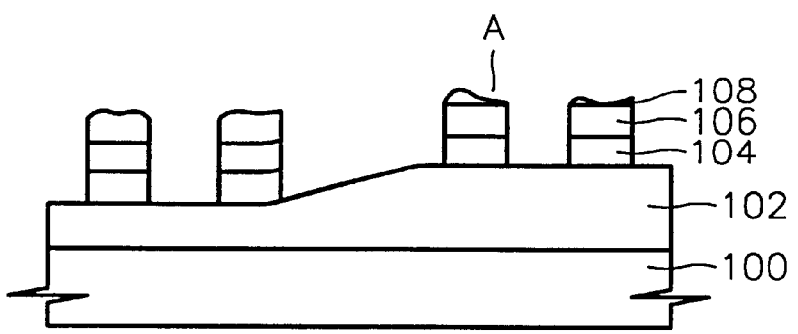
FIGS. 5 and 6 are sectional views similar to FIG. 4, respectively, and showing steps of etching the highly reflective layer using the ARC according to the method of the present invention.

Referring now to FIG. 5, the photoresist pattern 108 is formed using light having a wavelength of less than 450 nm and a mask having a light shield layer. The ARC 106 and the highly reflective layer 104 under the photoresist pattern 108 are then etched using the photoresist pattern 108 as a mask. In this case, the ARC 106 and the highly reflective layer 104 can be sequentially or simultaneously etched.

When the ARC 106 and the highly reflective layer 104 are respectively etched, the ARC can be etched under the same conditions as those in which a $SiO_2$ layer is generally etched. The highly-reflective layer 104 is etched using a process suited to the characteristics of the highly reflective layer.

When the highly reflective layer is a $SiO_2$ layer or a SiN layer, it is possible to simultaneously etch the ARC 106 and the highly reflective layer 104. In the present embodiment, the ARC 106 and the highly reflective layer 104 are dry etched. When the DUV type of photoresist layer is used and the highly reflective layer 104 is an $SiO_2$ layer, it is possible to simultaneously remove the ARC 106 and the highly reflective layer 104 by controlling the power to within a range of 0 to 2,000 W, the pressure to within a range of 0 to 500 mTorr, and the etching time after etching gases of about 0 to 50 sccm of oxygen, about 0 to 1,000 sccm of argon, and about 0 to 50 sccm of methane $CH_4$ have been introduced. When the highly reflective layer 104 is a SiN layer, it is possible to simultaneously remove the ARC 106 and the highly reflective layer 104 by controlling the power to within a range of 0 to 2,000 W, the pressure to within a range of 0 to 500 mTorr, and the etching time after etching gases of about 0 to 50 sccm of oxygen, about 0 to 1,000 sccm of argon, about 0 to 50 sccm of CO, and about 0 to 100 sccm of $CHF_3$ have been introduced. Note, although the etching conditions have been described in detail when a $SiO_2$ layer and a SiN layer are used as the highly reflective layer, such etching conditions can differ depending on the characteristics of the thin film used as the highly reflective layer 104.

Also, although the consumption (A) of the photoresist pattern 108 occurs during the etching of the ARC 106 and the highly reflective layer 104, the portion of the ARC 106 formed under the photoresist pattern 108 remains. Therefore, the ARC 106 can be used as a mask in a subsequent etching or ion implanting process. The ARC 106, that is, the amorphous carbon film formed using only the hydrocarbon based gas, has an etching selectivity of 0.7 with an i-line photoresist, at least 0.5 with a DUV photoresist, and at least 5 with a $SiO_2$ film.

Figure 6:
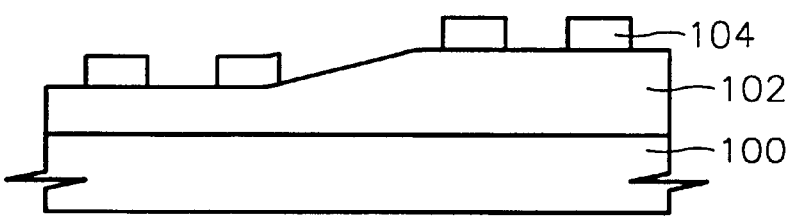

As shown in FIG. 6, the ARC 106 can be removed along with the photoresist pattern 108 without using a dry etching process. Here, the photoresist pattern can be removed by an ashing process using $O_2$ plasma, or an $H_2SO_4$ stripping process.

In the prior art, the ARC 106 must be removed by performing a dry etching process in addition to that used to remove the photoresist pattern. However, the ARC 106 according to the present invention, that is, the amorphous carbon film formed using only the hydrocarbon based gas, is an organic material. Therefore, the ARC 106 can be removed in the process of removing the photoresist pattern 108. The present invention thus contributes to simplifying the processes of manufacturing the semiconductor device and to reducing the throughput time by doing away with the need for a dry etching step.

Figure 7:
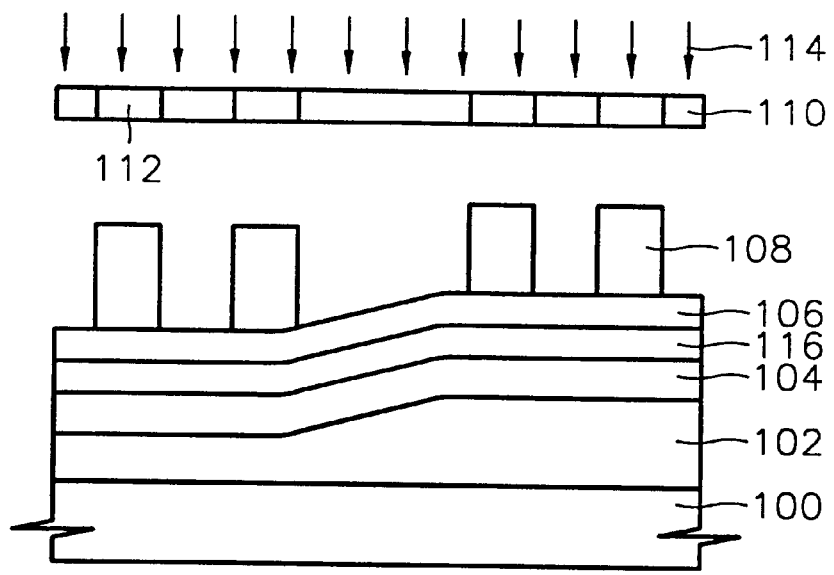
FIG. 7 is a sectional view of a semiconductor substrate, and shows a second embodiment of a method of forming a photoresist pattern using an ARC according to the present invention.

Referring now to the embodiment of FIG. 7, a transparent or semitransparent insulating film 116 is formed below the photoresist layer and between the highly reflective film 104 and the ARC 106. The transparent or semi-transparent insulating film 116 can be formed of polysilicon oxide, polysilicon oxide to which impurities are added, thermally grown silicon oxide, or SiON. The insulating film 116 changes the phase difference between waves reflected to the photoresist layer in a manner that enhances the effect of the ARC.

In this embodiment, the insulating film 116 is etched instead of the highly reflective layer 104 formed of conductive metals having a high reflexibility, such as W, $WSi_x$, $TiSi_x$, Al, or an Al alloy. Therefore, either the conductive metal layer or the insulating film can be the layer which is etched when using the ARC 106. Since the other layers and the steps of forming these layers are the same as those described in connection with the first embodiment, descriptions thereof will be omitted.

Figure 8:
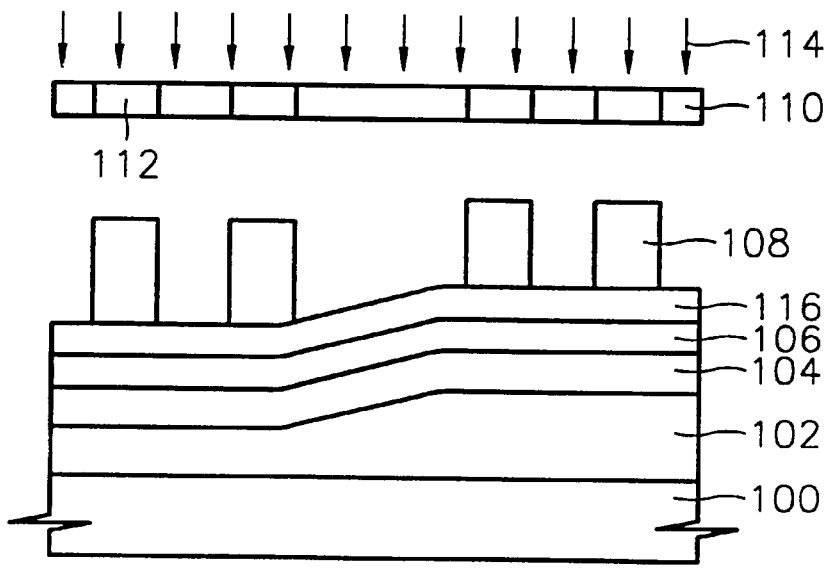
FIG. 8 is a view similar to that of FIG. 7 but showing a modified version of the second embodiment of a method of forming a photoresist pattern using an ARC according to the present invention.

As shown in FIG. 8, the transparent or semi-transparent insulating film 116 can be formed on the ARC 106. Because the materials and the steps of forming the other layers are the same as those described in connection with the first embodiment, detailed descriptions thereof will be omitted.

Hereinafter, characteristics of an amorphous carbon film using only the hydrocarbon based gas formed, according to the present invention, will be described in detail.

Figure 9:
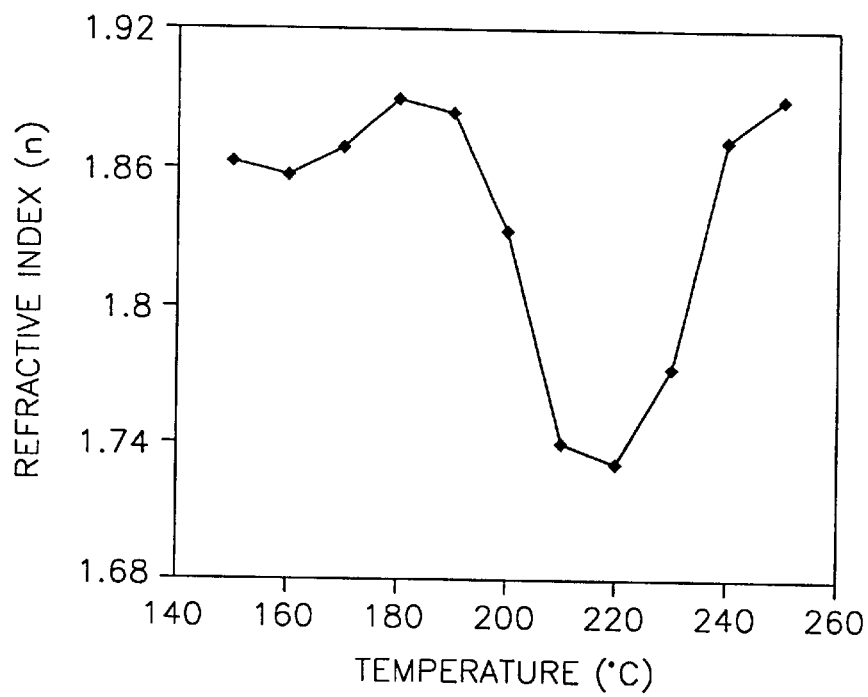
FIG. 9 is a graph showing the refractive index characteristic with respect to the temperature of an ARC formed according to the present invention.

FIG. 9 is a graph of the refractive index with respect to the temperature of the ARC.

Referring to FIG. 9, the temperature (° C.) of a plate to which the ARC according to the present invention was attached is plotted along the X axis, and the refractive index (n) is plotted along the Y axis. When the temperature was raised from 140° C. to 260° C., the refractive index was maintained within the desired range of from 1.2 to 2.5. Accordingly, an ARC having such a refractive index can exist as the various processes of forming the semiconductor device are carried out.

Figure 10:
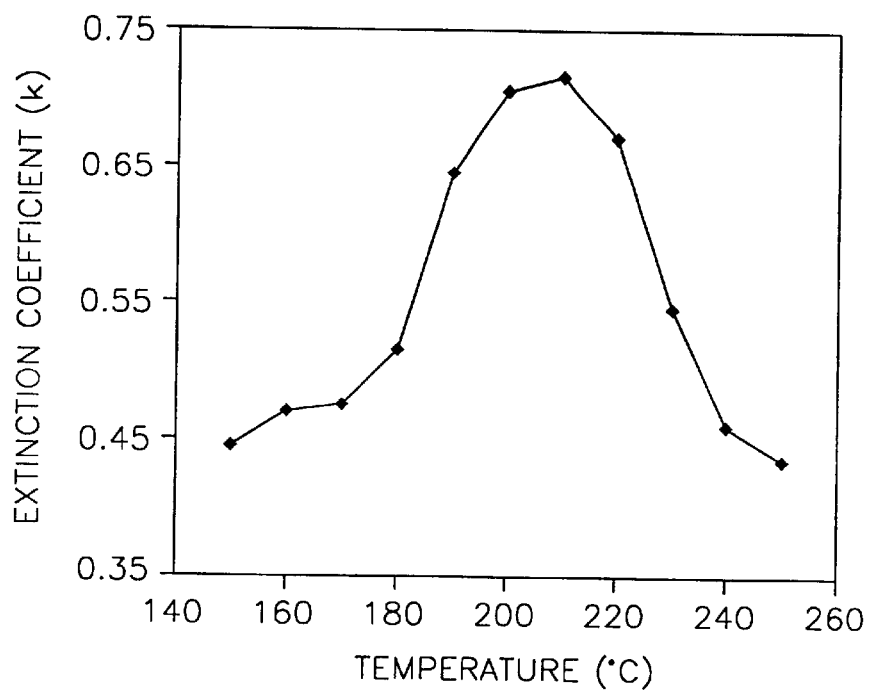
FIG. 10 is a graph showing the extinction coefficient characteristic with respect to the temperature of an ARC formed according to the present invention.

FIG. 10 is a graph of the extinction coefficient characteristic with respect to the temperature of the ARC.

Referring to FIG. 10, the temperature (° C.) of a plate to which the ARC according to the present was attached is plotted along the X axis whereas the extinction coefficient (k) is plotted along the Y axis. When the temperature was raised from 140° C. to 260° C., the extinction coefficient was maintained within the desired range of 0.2 to 0.8. Accordingly, an ARC having such an extinction coefficient can also exist as the various processes of forming the semiconductor device are carried out.

Figure 11:
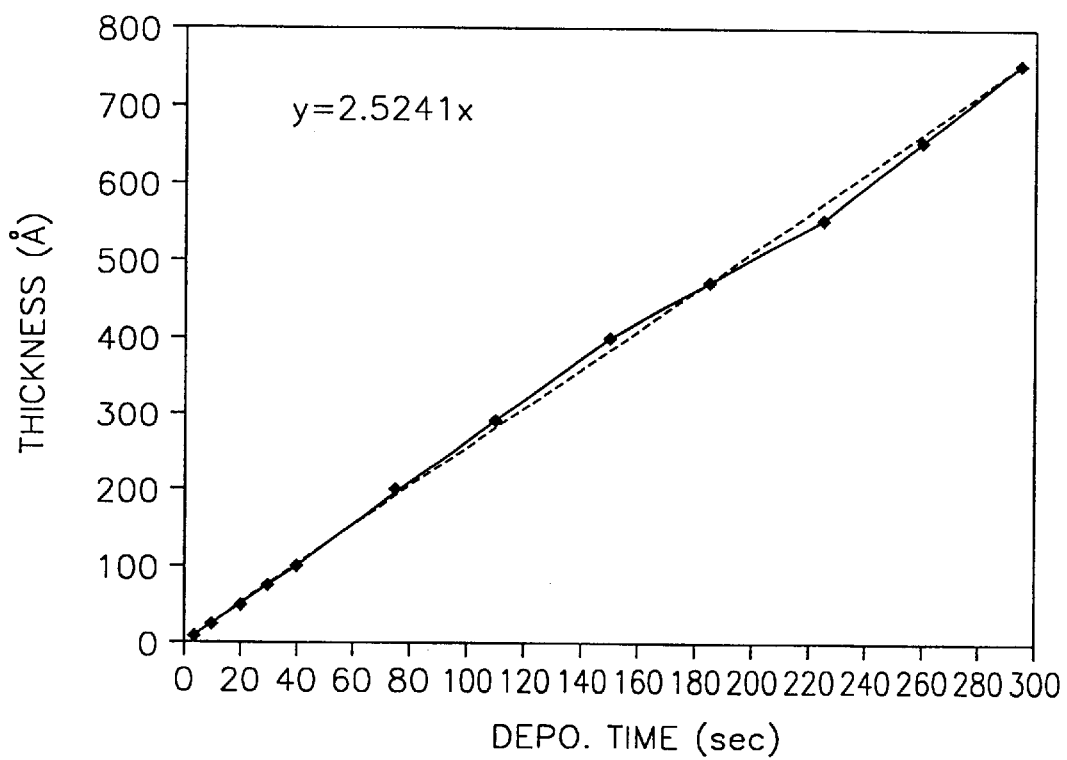
FIG. 11 is a graph showing the thickness according to the change of the deposition time of an ARC formed according to the present invention.

FIG. 11 is a graph of the thickness of the ARC according to the length of the deposition time of the ARC.

Referring to FIG. 11, the time (sec) during which the thin film was deposited using PECVD is plotted along the X axis whereas the thickness (Å) of the film is plotted along the Y axis. As shown in the graph, the thickness of the ARC increases in almost direct proportion to the deposition time. This shows that an amorphous carbon film of a desired thickness can be easily formed by controlling the deposition time.

Figure 12:
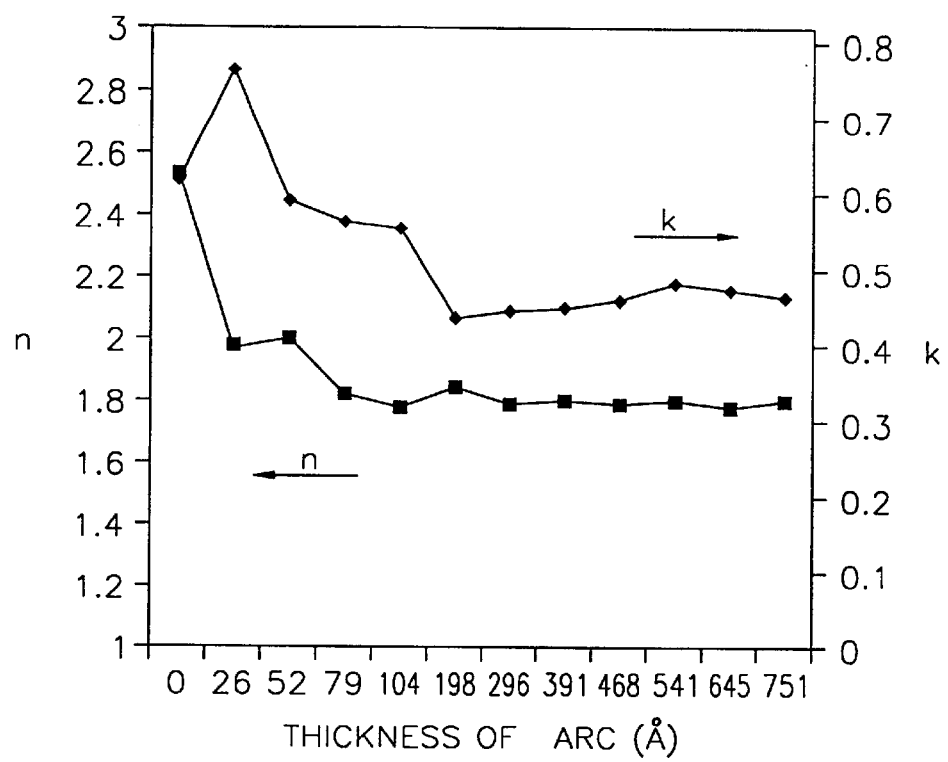
FIG. 12 is a graph showing the changes in the refractive index and the extinction coefficient according to changes in thickness of an ARC formed according to the present invention.

FIG. 12 is a graph illustrating changes in the refractive index (n) and the extinction coefficient (k) with respect to changes in the thickness of the ARC according to the present invention.

Referring to FIG. 12, the thickness (Å) of the ARC is plotted along the X axis, and the extinction coefficient (k) and the refractive index (n) are plotted along the Y axes. In general, when an ARC is used in the manufacturing of a semiconductor device, its reflectivity depends on its thickness. Accordingly, the critical dimension (CD) varies. Therefore, in the prior art, it was of critical importance to form the ARC at a specific thickness. However, the ARC according to the present invention, that is, the amorphous carbon film formed using only the hydrocarbon based gas, has a uniform refractive index and extinction coefficient so long as the thickness thereof is not less than 150 Å. Accordingly, the ARC according to the present invention allows for much more tolerance in the processes of manufacturing a semiconductor device than does the ARC produced according to the prior art.

Figure 13:
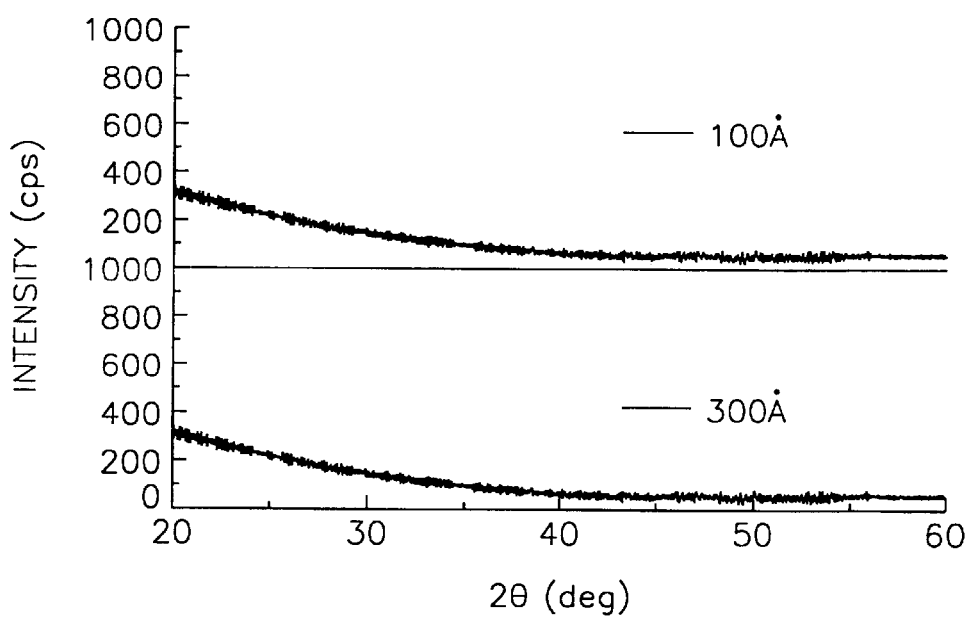
FIG. 13 is a graph showing an X-ray diffraction surface analysis of an ARC formed according to the present invention.

FIG. 13 is a graph showing the surface analysis of the ARC according to the present invention, using X-ray diffraction (XRD).

Referring to FIG. 13, the incident angle (2θ) is plotted along the X axis and the intensity (cps) of the incident light is plotted along the Y axis. ARCs which were formed to thicknesses of 100 Å and 300 Å according to the present invention were used as samples. In order to obtain a surface analysis result, the value of the intensity of light was obtained by fixing the samples and varying the angle of incidence of X-ray light (2θ) from 20 through 60 degrees. As indicated in the graph, the ARC according to the present invention has an amorphous structure. Therefore, the ARC has a relatively stable extinction coefficient and refractive index with respect to the light source used during exposure.

Figure 14:
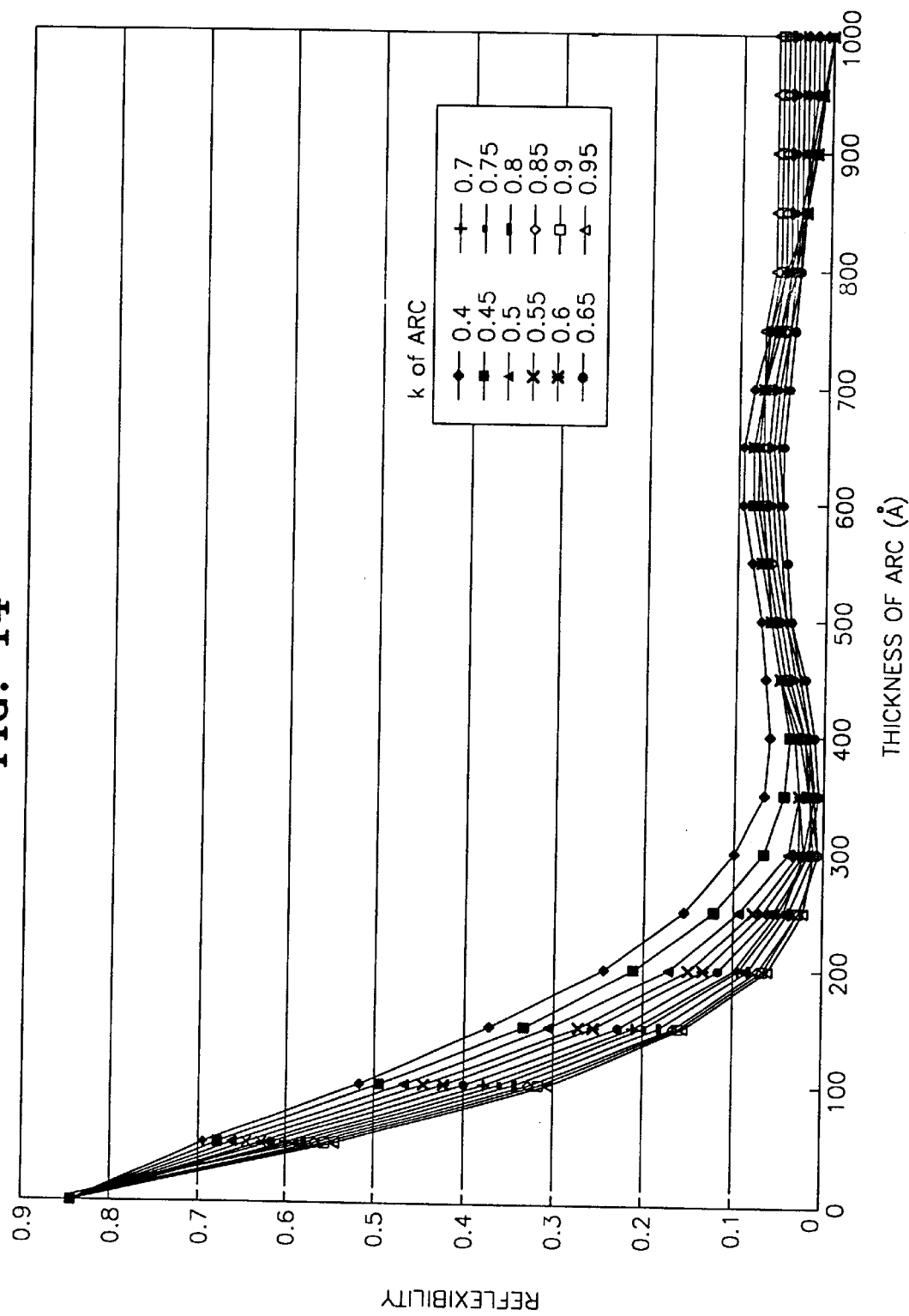
FIGS. 14 and 15 are graphs showing simulation results of the refractive index and the reflexibility according to the extinction coefficient of an ARC formed according to the present invention when a highly reflective film is formed of aluminum.
Figure 15:
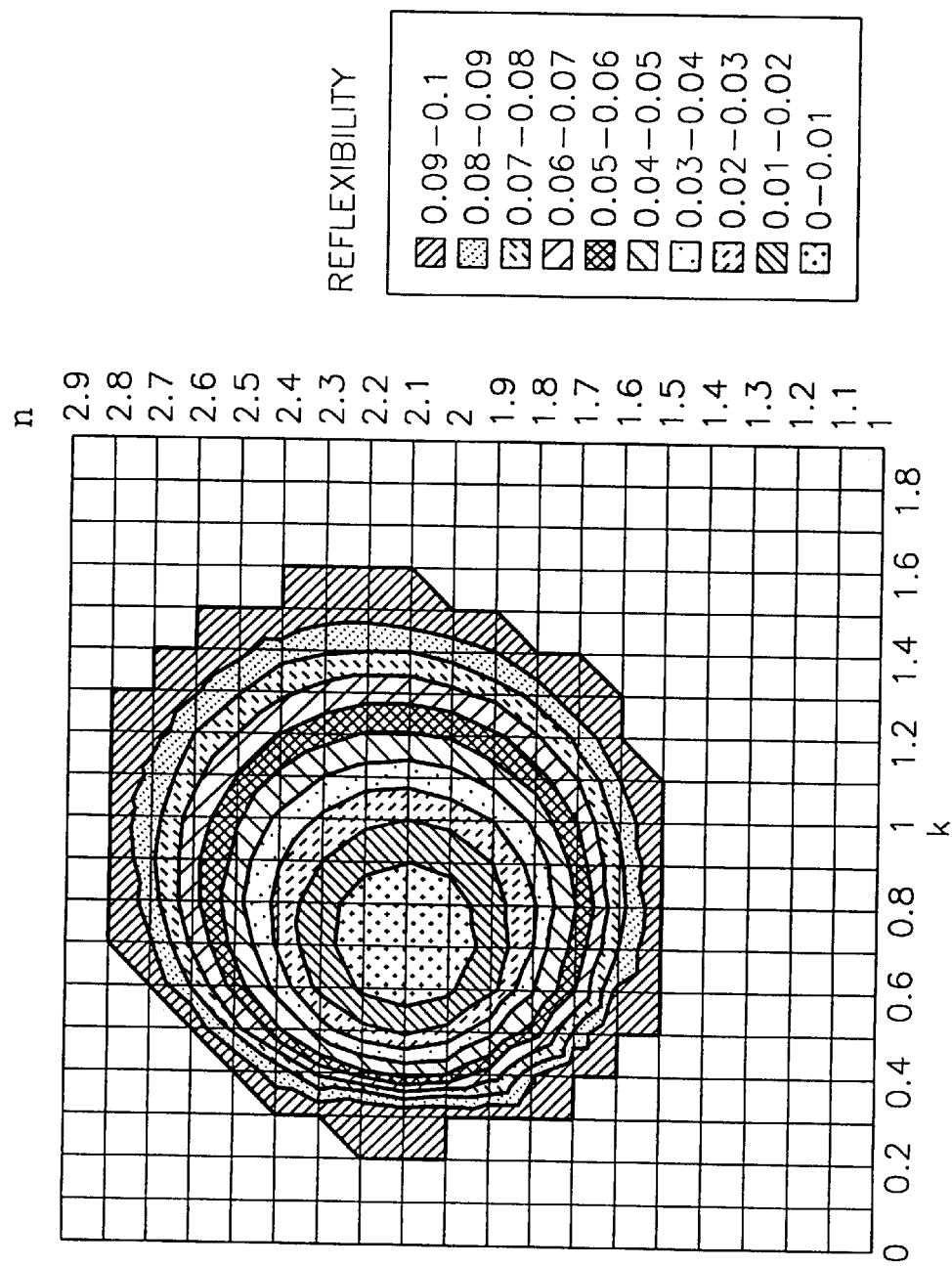

FIGS. 14 and 15 are graphs showing simulation results of the reflectivity according to the refractive index and the extinction coefficient of the ARC when the highly reflective layer is formed of Al.

FIG. 14 is a graph showing reflexibility when the refractive index of the ARC is fixed at a value of 1.81 and the thickness (the X axis of the graph) and the extinction coefficient (the legend of the graph) of the ARC are changed.

FIG. 15 is a graph showing the reflexibility when the thickness of the ARC is fixed to a value of 300 Å, and the refractive index (the Y axis of the graph) and the extinction coefficient (the X axis of the graph) are changed. As shown in the graphs, the ARC has a reflexibility of less than 5% when the refractive index is between 1.6 and 2.4 and when the extinction coefficient is between 0.4 and 1.1. Therefore, the ARC according to the present invention is most effective as a mask in etching the highly reflective layer when its extinction coefficient is between 1.2 and 2.5 and its extinction coefficient is between 0.2 and 0.8.

Figure 16:
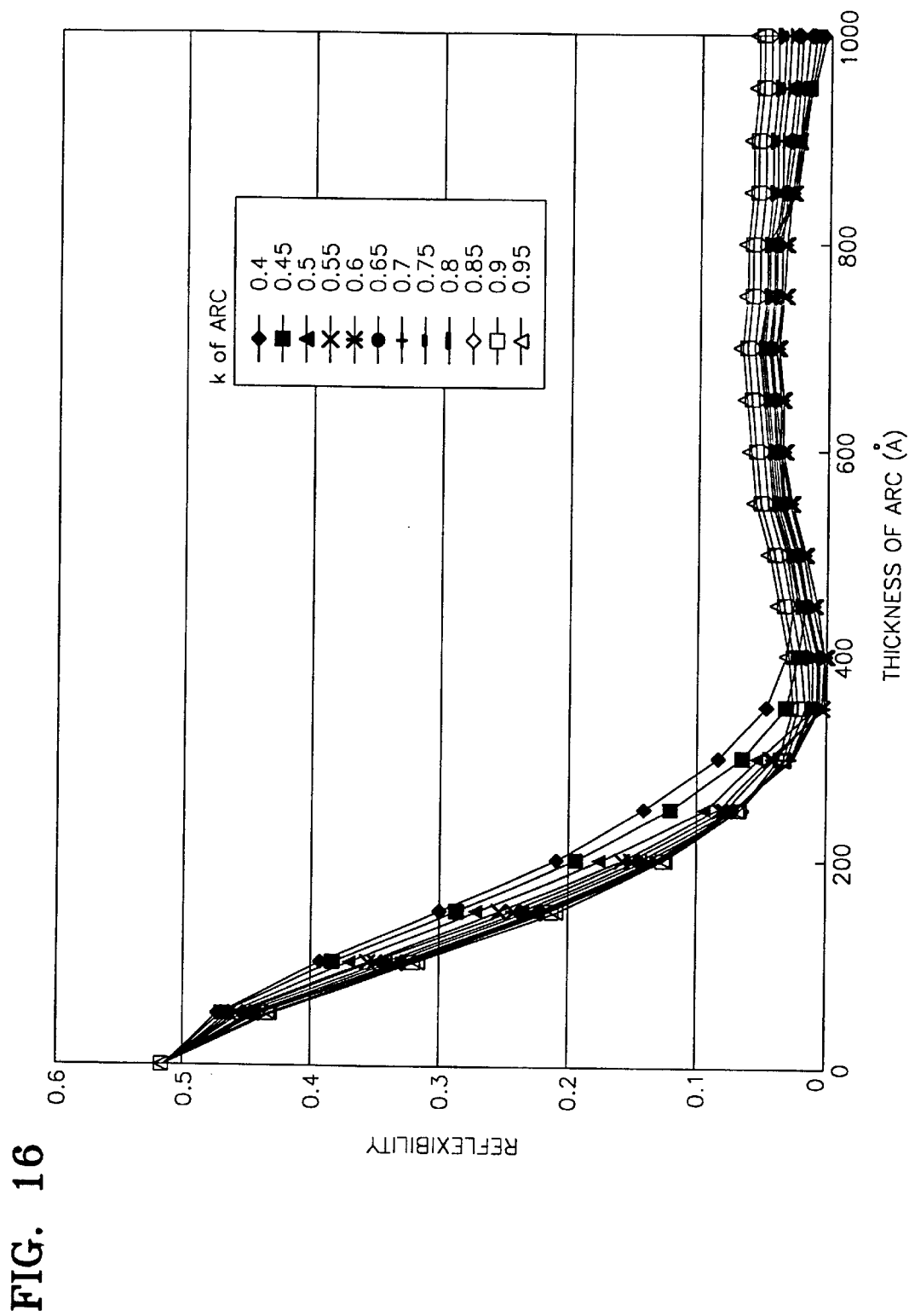
FIGS. 16 and 17 are graphs showing simulation results of the refractive index and the reflexibility according to the extinction coefficient of an ARC formed according to the present invention when the highly reflective film is formed of a silicon film.
Figure 17:
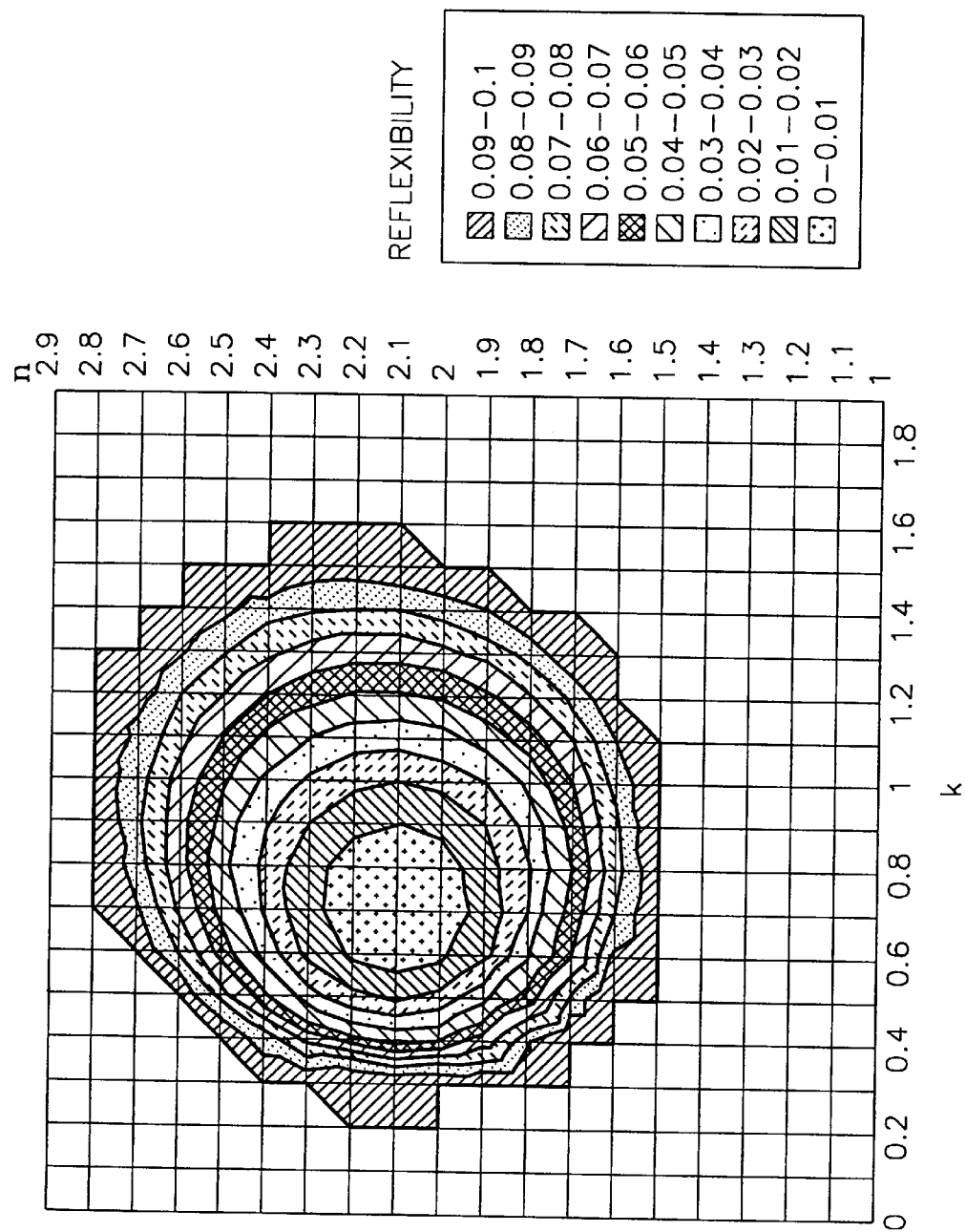

FIGS. 16 and 17 are graphs showing simulation results of the reflexibility according to the refractive index and the extinction coefficient when the highly reflective film is formed of a silicon layer.

In FIGS. 16 and 17, the parameters measured are the same as those in FIGS. 14 and 15. In this case, however, in which a highly reflective layer of silicon was used, the ARC has a reflexibility of less than 5% when its refractive index is between 1.6 and 2.4 and its extinction coefficient is between 0.4 and 1.1.

Although the present invention has been described in detail above in connection with certain preferred embodiments thereof, the present invention is not limited to such embodiments. For example, PECVD has been disclosed as the preferred process for forming the ARC. However various other methods, such as a sputtering method, a chemical vapor deposition (CVD) method, and a laser ablation method can be used. Therefore, all such various changes and modifications are seen to be within the true spirit and scope of the present invention as defined by the appended claims.

What is claimed is:

1. A method of forming a pattern on a semiconductor substrate, comprising the steps of:

providing a semiconductor substrate on which an underlayer having a stepped portion is formed;

forming a layer, highly reflective of photoresist exposure light, over the semiconductor substrate on which the underlayer is formed, whereby the highly reflective layer also has a stepped portion;

exposing the semiconductor substrate, having the highly reflective layer formed thereon, only to a hydrocarbon based gas in forming over the highly reflective layer an anti-reflective coating that prevents at least some of the photoresist exposure light from reflecting therefrom;

forming a photoresist over the anti-reflective coating; and subsequently exposing selected portions of the photoresist to the exposure light and developing the photoresist to produce a photoresist pattern.

2. The method of claim 1, wherein said step of providing a semiconductor substrate comprises providing a substrate selected from the group consisting of a single crystal silicon substrate, an SOI substrate, an SOS substrate, and a gallium arsenide substrate.

3. The method of claim 1, wherein said step of forming a layer, highly reflective of exposure light, comprises forming a layer of a material selected from a group consisting of W, $WSi_x$, $TiSi_x$, Al, and an Al alloy.

4. The method of claim 1, wherein said step of exposing comprises exposing the semiconductor substrate, having the highly reflective layer formed thereon, only to a hydrocarbon based gas selected from the group consisting of methane, ethane, propane, butane, acetylene, propene, and n-butane gas.

5. The method of claim 1, wherein said step of exposing the semiconductor substrate, having the highly reflective layer formed thereon, only to a hydrocarbon based gas in forming thereon an anti-reflective coating comprises forming an amorphous carbon film, having a refractive index of between 1.2 and 2.5 with respect to the exposure light, over the highly reflective layer.

6. The method of claim 1, wherein said step of exposing the semiconductor substrate, having the highly reflective layer formed thereon, only to a hydrocarbon based gas in forming thereon an anti-reflective coating comprises forming an amorphous carbon film, having an extinction coefficient between 0.2 and 0.8, over the highly reflective layer.

7. The method of claim 1, and further comprising the step of annealing the anti-reflective coating in-situ.

8. The method of claim 1, and further comprising the steps of performing a plasma process on the anti-reflective coating, performing an E-beam process on the anti-reflective coating, and curing the anti-reflective coating to increase the density thereof.

9. The method of claim 1, wherein said step of exposing the semiconductor substrate, having the highly reflective layer formed thereon, only to a hydrocarbon based gas comprises performing plasma enhanced chemical vapor deposition to deposit the anti-reflective coating on the highly reflective layer.

10. The method of claim 9, and further comprising controlling the temperature at upper and lower parts of the substrate while the hydrocarbon based gas is being deposited.

11. The method of claim 1, wherein said step of exposing the semiconductor substrate, having the highly reflective layer formed thereon, only to a hydrocarbon based gas in forming thereon an anti-reflective coating comprises forming an amorphous carbon film over the highly reflective layer.

12. The method of claim 11, and further comprising the step of adding at least one additive selected from the group consisting of oxygen, tin, lead, silicon, fluorine, and chlorine to the amorphous carbon film.

13. The method of claim 1, and further comprising a step of forming an insulating film, at least partially transparent to the exposure light, between the highly reflective layer and the photoresist pattern.

14. The method of claim 13, wherein said step of forming an insulating layer comprises forming the insulating layer between the highly reflective layer and the anti-reflective coating.

15. The method of claim 13, wherein said step of forming an insulating layer comprises forming the insulating layer between the photoresist pattern and the anti-reflective coating.

16. The method of claim 13, wherein said step of forming an insulating layer comprises forming the insulating layer of a material selected from the group consisting of polysilicon oxide, thermally grown silicon oxide, and SiON.

17. A method of forming a semiconductor device, comprising the steps of:
providing a semiconductor substrate on which an underlayer having a stepped portion is formed;
forming a layer, highly reflective of exposure light, over the semiconductor substrate on which the underlayer is formed, whereby the highly reflective layer also has a stepped portion;
exposing the semiconductor substrate, having the highly reflective layer formed thereon, only to a hydrocarbon based gas in forming over the highly reflective layer an anti-reflective coating that prevents at least some of the exposure light from reflecting therefrom;
forming a photoresist over the anti-reflective coating;
subsequently exposing selected portions of the photoresist to the exposure light and developing the photoresist to produce a photoresist pattern;
etching the anti-reflective coating and the highly reflective layer under the photoresist pattern using the photoresist pattern as a mask; and
thereafter simultaneously removing the photoresist pattern and the anti-reflective coating.

18. The method of claim 17, wherein said step of exposing the semiconductor substrate, having the highly reflective layer formed thereon, only to a hydrocarbon based gas is carried out until the anti-reflective coating has a thickness of 150 to 10,000 Å.

19. The method of claim 17, wherein said step of exposing the semiconductor substrate, having the highly reflective layer formed thereon, only to a hydrocarbon based gas comprises exposing the semiconductor substrate having the highly reflective layer formed thereon only to a hydrocarbon based gas selected from the group consisting of methane, ethane, propane, butane, acetylene, propene, and n-butane gas.

20. The method of claim 17, and further comprising the step of annealing the anti-reflective coating in-situ.

21. The method of claim 17, and further comprising the steps of performing a plasma process on the anti-reflective coating, performing an E-beam process on the anti-reflective coating, and curing the anti-reflective coating to increase the density thereof.

22. The method of claim 17, wherein said step of etching comprises etching the anti-reflective coating and the highly reflective layer with gas including oxygen and argon.

23. The method of claim 17, wherein said step of etching comprises etching the anti-reflective coating, and then etching the highly reflective layer.

24. The method of claim 17, wherein said step of exposing the semiconductor substrate, having the highly reflective layer formed thereon, only to a hydrocarbon based gas comprises forming an amorphous carbon film over the highly reflective layer.

25. The method of claim 24, and further comprising the step of adding at least one additive selected from the group consisting of oxygen, tin, lead, silicon, fluorine, and chlorine to the amorphous carbon film.

26. The method of claim 17, wherein said step of exposing the semiconductor substrate having the highly reflective layer formed thereon, only to a hydrocarbon base gas in forming over the highly reflective layer an anti-reflective coating comprises formin an anti-reflective coating by controlling the temperature to remain between 0 and 400° C. at a showerhead and substrate of chamber.

27. The method of claim 26, wherein the temperature is 200° C.

28. The method of claim 17, wherein said step of etching comprises the etching the anti-reflective coating and the highly reflective layer at the same time.

29. The method of claim 28, wherein said step of forming the highly reflective layer comprises forming a $SiO_2$ layer over the semiconductor substrate.

30. The method of claim 28, wherein said step of forming the highly reflective layer comprises forming a SiN layer over the semiconductor substrate.

* * * * *